United States Patent
Eichler et al.

(10) Patent No.: US 11,965,266 B2
(45) Date of Patent: Apr. 23, 2024

(54) DEVICE AND METHOD OF MANUFACTURING AIII-BV-CRYSTALS AND SUBSTRATE WAFERS MANUFACTURED THEREOF FREE OF RESIDUAL STRESS AND DISLOCATIONS

(71) Applicant: Freiberger Compound Materials GmbH, Freiberg (DE)

(72) Inventors: Stefan Eichler, Dresden (DE); Michael Rosch, Freiberg (DE); Dmitry Suptel, Dresden (DE); Ulrich Kretzer, Chemnitz (DE); Berndt Weinert, Freiberg (DE)

(73) Assignee: Freiberger Compound Materials GMBH, Freiberger (DE)

( * ) Notice: Subject to any disclaimer, the term of this patent is extended or adjusted under 35 U.S.C. 154(b) by 175 days.

(21) Appl. No.: 17/059,772

(22) PCT Filed: Jun. 3, 2020

(86) PCT No.: PCT/EP2020/065375
§ 371 (c)(1),
(2) Date: Nov. 30, 2020

(87) PCT Pub. No.: WO2020/245215
PCT Pub. Date: Dec. 10, 2020

(65) Prior Publication Data
US 2022/0106702 A1 Apr. 7, 2022

(30) Foreign Application Priority Data
Jun. 7, 2019 (DE) ...................... 10 2019 208 389.7

(51) Int. Cl.
*B32B 3/00* (2006.01)
*C30B 11/00* (2006.01)
(Continued)

(52) U.S. Cl.
CPC .......... *C30B 11/002* (2013.01); *C30B 11/003* (2013.01); *C30B 29/40* (2013.01); *C30B 29/42* (2013.01)

(58) Field of Classification Search
CPC ..... C30B 11/002; C30B 11/003; C30B 29/40; C30B 29/42
See application file for complete search history.

(56) References Cited

U.S. PATENT DOCUMENTS

| 4,666,681 A | 5/1987 | Ferrand et al. |
| 5,725,658 A | 3/1998 | Sawada |

(Continued)

FOREIGN PATENT DOCUMENTS

| CN | 101307501 | 11/2008 |
| DE | 19912486 | 9/2000 |

(Continued)

OTHER PUBLICATIONS

Japanese Office Action (Translation) dated Sep. 26, 2022 for Application No. JP 2020-563910.
(Continued)

*Primary Examiner* — Elizabeth E Mulvaney
(74) *Attorney, Agent, or Firm* — A.C. Entis-IP Ltd; Allan C. Entis

(57) ABSTRACT

A device (1', 1", 1'") for manufacturing III-V-crystals and wafers (14) manufactured therefrom, which are free of residual stress and dislocations, from melt (16) of a raw material optionally supplemented by lattice hardening dopants comprises a crucible (2', 2", 2'") for receiving the melt (16) having a first section (4', 4") including a first cross-sectional area and a second section (6') for receiving a seed crystal (12) and having a second cross-sectional area, wherein the second cross-sectional area is smaller than the first cross-sectional area and the first and second sections are (Continued)

connected with each other directly or via third section (8, 8') which tapers from the first section towards the second section, in order to allow a crystallization starting from the seed crystal (12) within the directed temperature field (T) into the solidifying melt. The first section (4', 4") of the crucible (2', 2", 2''') has a central axis (M), and the second section (6') is arranged being offset (v) with regard to the central axis (M) of the first section (4', 4").

19 Claims, 7 Drawing Sheets

(51) Int. Cl.
    *C30B 29/40*         (2006.01)
    *C30B 29/42*         (2006.01)

(56) References Cited

U.S. PATENT DOCUMENTS

| | | | |
|---|---|---|---|
| 6,007,622 | A | 12/1999 | Kawase et al. |
| 6,866,714 | B2 | 3/2005 | Kawase et al. |
| 7,214,269 | B2 | 5/2007 | Wachi et al. |
| 7,314,518 | B2 | 1/2008 | Wachi et al. |
| 9,368,585 | B2 | 6/2016 | Eichler et al. |
| 2004/0187768 | A1 | 9/2004 | Itani et al. |
| 2007/0079751 | A1 | 4/2007 | Matsumoto |
| 2008/0311417 | A1 | 12/2008 | Eichler et al. |
| 2009/0098377 | A1 | 4/2009 | Oshika |

FOREIGN PATENT DOCUMENTS

| | | |
|---|---|---|
| DE | 102007026298 | 12/2008 |
| EP | 1634981 | 3/2006 |
| JP | 06298588 | 10/1994 |
| JP | 8-119800 | 5/1996 |
| JP | 2000086398 | 3/2000 |
| JP | 2000203981 | 7/2000 |
| JP | 2005132717 | 5/2005 |
| JP | 2006143516 | 6/2006 |
| JP | 2009051728 | 3/2009 |
| JP | 2010064936 | 3/2010 |
| JP | 2010528964 | 8/2010 |
| JP | 2015231921 | 12/2015 |
| KR | 20060030515 | 4/2006 |
| NO | 2019008663 | 1/2019 |

OTHER PUBLICATIONS

Chinese Office Action (Translation) dated Aug. 15, 2022 for Application No. CN 202010496246.8.
Concise Edition of Research Work Report 1981-1982, p. 47, Ye Shizhong et al., Institute of Semiconductors, Chinese Academy of Sciences (Published Dec. 31, 1982).
European Office Action dated Sep. 22, 2022, for Application No. 20730425.4.
C. Frank K., et al., Crystal Research and Technology, vol. 31 (6), pp. 753-761.
Japanese Office Action dated Mar. 16, 2022 for Application No. 2020-563910 filed Jun. 3, 2020.
A. Grant Elliot et al., Low Dislocation Density, Large Diameter, Liquid Encapsulated Czochralski Growth of GaAS, Journal of Crystal Growth 70 1984, pp. 169-178.
J. P. Farges et al., Growth of Large Diameter Discloation-Free Indium Phosphide Ingots, Journal of Crystal Growth vol. 33, No. 2, May 2, 1987, pp. 159-166.
H. D. Geiler et al., Photoelastic characterization of residual stress in GaAS-wafers, Materials Science in Semiconductor Processing 9, 2006, pp. 345-350.
Martin Herms et al., Defect-Induced Stress Imaging in Single and Multi-crystalline Semiconductor Materials, Materials Today: Proceedings, vol. 5, No. 6, Jan. 1, 2018, pp. 14748-14756.
Manfred Jurisch et al., Handbook of Crystal Growth Bulk Crystal Growth: Basic Techniques vol. 2, Part A, Chapter 9 Vertical Bridgman Growth of Binary Compound Semiconductors, 2015.
M Morishita et al., Development of Si-doped 8-inch GaAs substrates, Conference Proceedings CS Mantech 2018; Url: http://csmantech2018.conferencespot.org/65967-gmi-1.4165182/100 17 -1.4165620/f0017-1.4165621/0128-0199-000053-1.4165656/ap0? 4-1. 4165657.
B. Pichaud et al., Study of Dislocations in Highly In Doped GaAs Crystal Grown by Liquid Encapsulation Czochralski Technique, Journal of Cystal Growth 71, 1985, pp. 648-654.
M. L. Young et al., Electric Inhomogeneity in 1" diameter partially disclocation-free undoped LEC GaAs, Semicond. Sci. Technol. 3, 1988, pp. 292-301.
Taiwanese Office Action dated Nov. 3, 2020 for Application No. 109206980.
German Office Action dated Jan. 14, 2020 for Application No. 10 2019 208 389.7.
PCT Search Report and Written Opinion dated Aug. 14, 2020 for Application No. PCT/EP2020/065375 filed Jun. 3, 2020.
Taiwanese Office Action dated Dec. 18, 2020 for Application No. 109118710.
Product catalogues by DOWA Electronic Materials Co., Ltd., Tokyo, Japan, AXT, Inc., Freemont, CA or Sumitomo Electric Industries, Ltd., Osaka, Japan; Url: http://www.dowa-electronics.co.jp/semicon/e/gaas/gaas.html.
Korean Office Action dated Jul. 20, 2022 for Application No. 10-2021-7016136 .
Jun Yang et al: "VGF growth of high quality InAs single crystals with low dislocation density", Journal of Crystal Growth, Elsevier, Amsterdam, NL, vol. 531, Nov. 12, 2019.
B. Birkmann et al: "Investigation of residual dislocations in VGF-grown Si-doped GaAs", Journal of Crystal Growth, Elsevier, Amsterdam, NL, vol. 276, No. 3-4, Apr. 1, 2005, pp. 335-346.
Euorpean Office Action dated Feb. 24, 2022 for application No. 20730425.4 filed Jun. 3, 2020.
Taiwanese Office Action dated Aug. 25, 2021 for Application No. 109118710, Filed Jun. 3, 2020 .
Japanese Office Action (Translation) dated Jul. 11, 2023 for Application No. JP 2022-090346.

DEVICE AND METHOD OF MANUFACTURING AIII-BV-CRYSTALS AND SUBSTRATE WAFERS MANUFACTURED THEREOF FREE OF RESIDUAL STRESS AND DISLOCATIONS

RELATED APPLICATIONS

The present application is a U.S. National Phase of PCT Application No. PCT/EP2020/065375, filed on Jun. 3, 2020, which claims the benefit under 35 U.S.C 119(a)-(d) from German application 10 2019 208 389.7, filed on Jun. 7, 2019. The contents and disclosures of these prior applications are incorporated herein by reference.

FIELD OF THE INVENTION

The invention relates to a device and method for manufacturing AIII-BV-single-crystals and in particular gallium arsenide or indium phosphide single crystals free of residual stress and dislocations, and further relates to wafers manufactured therefrom by freezing or solidifying a melt of the semiconductor material using a seed crystal formed from the same semiconductor material as the semiconductor single-crystal to be manufactured.

BACKGROUND

With regard to an application of gallium arsenide or indium phosphide substrate wafers for manufacturing light emitting components having an increased power density such as for example edge emitting semiconductor lasers or vertical cavity surface emitting semiconductor lasers, dislocations act as a non-emitting recombination centre and thus as a defect which affects yield and lifetime, respectively. Accordingly, AIII-BV substrate wafers low in dislocation are used nowadays in such applications. AIII-BV single crystals or wafers herein denote crystals from compounds selected from groups III and V of the periodic system of elements. Dislocations develop based on the elastic and plastic properties of the materials and the presence of curvatures of the temperature field leading to the stress during the cooling of the crystal (after its solidification). As growth methods the Vertical Bridgeman (VB) or Vertical Gradient Freeze (VGF) methods may substantially only be considered due to the comparatively small curvatures of the temperature field, or methods thermally conducted in an analogous manner (see, e.g., M. Jurisch et al. in *Handbook of Crystal Growth Bulk Crystal Growth: Basic Techniques* VOLUME II, Part A, Second Edition, Chapter 9 "*Vertical Bridgman Growth of Binary Compound Semiconductors*", 2015).

DE 199 12 486 A1 describes an apparatus for growing gallium arsenide crystals. The apparatus comprises a crucible arranged in a furnace and configured to receive raw melt within the first section including a first cross-sectional area having a larger diameter which roughly corresponds to a diameter of the finally manufactured single-crystal, and a second section which specifically receives the seed crystal that serves as a starting point for crystallization of the melt, the second section having a comparatively smaller diameter and being denoted as the seed channel. The seed crystal itself has a length of about 40 mm and a diameter of about 8 mm corresponding to the diameter of the seed channel. Due to the measures proposed in the document—the seed crystal is freely standing in the seed channel and the space between the seed crystal and the crucible in the section of the seed channel is filled with liquid boron oxide ($B_2O_3$)—dislocation densities ranging from 1.000 to 10.000 $cm^{-2}$ in the cross-sectional area of the grown crystal are achieved.

The formation of dislocations can be impeded by adding so-called lattice hardening dopants (e.g. boron, silicon, zinc, sulphur), see for example A. G. Elliot et al., Journal of Crystal Growth 70 (1984) 169-178 or B. Pichaud et al., Journal of Crystal Growth 71 (1985) 648-654. For example, US 2006/0081306 A1 or U.S. Pat. No. 7,214,269 B2 describe the manufacturing of silicon doped gallium arsenide single crystals pursuant to the Vertical Bridgeman (VB)—or the Vertical Gradient Freeze (VGF)—methods. The crucible used therefore is formed from pBN (pyrolytic boron nitride) and has a diameter of 80 mm and the length of 300 mm, wherein the seed channel has a diameter of 10 mm. By adding silicon an average dislocation density of 5.000 $cm^{-2}$ is achieved in a cross-sectional area of the crystal.

Nowadays, with regard to the manufacturing of silicon doped GaAs average dislocation densities of less than 100 $cm^{-2}$ are typically achieved for wafers having diameters of 100 mm or 150 mm, or less than 5.000 $cm^{-2}$ for wafers having diameters of 200 mm (e.g. M. Morishita et al. in "*Development of Si-doped 8-inch GaAs substrates*", Conference Proceedings CS MANTECH 2018, download under http://csmantech2018.conferencespot.org/65967-gmi-1.4165182/t0017-1.4165620/f0017-1.4165621/0128-0199-000053-1.4165656/ap074-1.4165657, or product catalogues by DOWA Electronic Materials Co., Ltd., Tokyo, Japan, with download under http://www.dowa-electronics.co.jp/semicon/e/gaas/gaas.html#semi; AXT, Inc., Freemont, CA or Sumitomo Electric Industries, Ltd., Osaka, Japan). Without adding lattice hardening dopants, average dislocation densities ranging from 1.500 to 10.000 $cm^{-2}$ can be achieved for wafers having diameters of 100 mm and 150 mm, or less than 12.000 $cm^{-2}$ for wafers having diameters of 200 mm (see references above).

For the determination of the dislocation density, there exist standardized measurement methods (SEMI M83: Test method for determination of dislocation etch pit density in monocrystals of III-V compound semiconductors, SEMI M36—Test method for measuring etch pit density (EPD) in low dislocation density gallium arsenide wafers). With regard to wafers where the surface orientation does not differ from the crystallographic orientation {100} by more than 15°, dislocations are made visible by selective etching. Thereby, etch pits having an extension of about 30-60 µm develop, which may be counted using an optical microscope (magnification about 50× to 200×). For materials having a low dislocation density there are typically applied measurement fields having an area ranging from 0.25 $mm^2$ to 1 $mm^2$—whereby the whole wafer surface considering an edge exclusion of for example 1 mm is analyzed. As a quantity measured for each measurement field each a local etch pit density $EPD_L$ is obtained. The arithmetic mean of the local etch pit densities yields an average etch pit density $EPD_{av}$ of the wafer. Furthermore, relative amounts of the number of measurement fields which have a value of $EPD_L$, which is equal to or less than a predetermined limit value, as compared to the total number of measurement fields can be specified, for example $P(EPD_L=0\ cm^{-2})$ as the relative amount of measurement fields having a local local etch pit density of 0 $cm^{-2}$ (dislocation-free measurement field). With regard to a material having very low dislocations also the specification of the total number of the dislocation etch pits contained in the measurement fields as EPC (etch pit count) may be meaningful. If the measurement fields cover the whole wafer surface, the total number of dislocations $EPC_{total}$ (etch pit count total) contained in the wafer may be obtained. In order to determine the dislocation density of the single-crystal, multiple wafers, in anyway at least one wafer, are measured at the beginning (region of the crystal that is first freezed or solidified) and at the end (finally freezed or solidified region of the crystal).

In US 2006/0081306 A1 or U.S. Pat. No. 7,214,269 B2, the disclosed properties of the substrate wafers as manufactured from the crystals include a charge carrier concentration of $(0.1\text{-}5.0) \cdot 10^{18}$ cm$^{-3}$ at a dislocation density of 5.000 cm$^{-2}$ or less. For electrical and/or optical components having high electrical and optical power densities, there is, however, required an even considerably lower dislocation density.

The dislocation density of semiconductor crystals can be reduced by adding a dopant which affects a hardening of the crystal lattice. In JP 2000-086398 A there is disclosed a method, wherein by additionally doping with silicon and boron the dislocation density of p-conducting, zinc-doped gallium arsenide crystals can be reduced to values below 500 cm$^{-2}$.

A method of further reducing the dislocation density is disclosed in US 2004/0187768 A1. Due to an additional doping of the crystals with elements, which are incorporated into the crystal lattice of gallium arsenide in an iso-electronical manner, for example indium in addition to silicon (Si), zinc (Zn), and boron (B), the dislocation density in p-conductive gallium arsenide crystals may be reduced even to values below 100 cm$^{-2}$, if concrete and mutually coordinated concentrations of the dopant atoms is complied with. The charge carrier concentration of the single-crystal thus obtained amounts to $1.0 \cdot 10^{17}$ through $6.0 \cdot 10^{18}$ cm$^{-3}$.

The single-crystal manufactured according to one embodiment in US 2004/0187768 A1 pursuant to the VB-method (see FIG. 4 therein) has a diameter of about 3" (75 mm) and a length (cylindrical region) of 180 mm. In order to measure the local dislocation density, a wafer had been separated from the GaAs single crystal and its surface subjected to an KOH-etching solution. The surface had been measured per measurement fields sized as 1×1 mm$^2$, which were positioned in a rectangular measurement grid having a grid width of 5 mm, with respect to the number of the etch pits which formed during the edging. In 134 out of the 177 measurement fields sized as 1×1 mm$^2$ no dislocations were detected. The average dislocation density amounted to 28 cm$^{-2}$. In a comparative example in which no indium had been added as a dopant (see FIG. 5 therein) measurement fields free of dislocations were detected in only 58 out of the 177 measurement fields sized as 1×1 mm$^2$. The average dislocation density thereby amounted to 428 cm$^{-2}$.

These crystals reflecting the values described in literature and the wafers manufactured therefrom still reveal, however, a perceptible amount of residual stress as will be demonstrated below, which may result from the dislocations and which may further interact with native or intrinsic defects, such that in turn they may be exerted effects on the properties of the respective electrical and/or optical components produced. It would thus be desirable to also reduce the amount of residual stress significantly. A sensitive and efficient method for quantifying the amount of residual stress of wafers formed from semiconductor crystals is disclosed for example in Geiler, H. D., et al. in "*Photoelastic characterization of residual stress in GaAs-wafers*" in Materials Science in Semiconductor Processing 9 (2006) S. 345-350, and is generally denoted as the SIRD-method (SIRD: rapid scanning infrared transmission polarimeter).

By means of the SIRD-method full-surface shear stress images of a crystal or wafer, respectively, having a typical lateral resolution of 100 μm can be obtained. A linearly polarized laser beam in the infrared wavelength range (1.3 μm) is directed perpendicularly onto the surface and through the crystal/wafer. Due to stress-induced birefringence in the crystal/wafer, the electrical field vector is divided into two components orthogonal to each other, an ordinary ray and an extraordinary ray. The material and thickness dependent phase shift present after exiting the crystal/wafer between the two ray components is measured. The measured phase shift can be used to assess the shear stress by means of a given physical relationship regarding the surface. By means of a suitable device, the laser beam can be directed to as many points on the surface of the crystal/wafer as desired such that the shear stress can be determined at each position.

BRIEF SUMMARY OF THE INVENTION

It is an object of the invention to provide a device and a method for manufacturing a single-crystal, preferably a GaAs single-crystal, with which—either using or not using lattice hardening dopants such as or example boron, silicon, zinc, sulphur, indium etc.—a further significant improvement in the quality of single-crystals and wafers manufactured therefrom can be achieved. It is a further object of the invention to provide a single-crystal, preferably a AIII-BV-single-crystal, more preferably a GaAs single-crystal that forms a basis for manufacturing components with an improved electrical and/or optical power density.

The object is solved by a device for manufacturing a crystal from a melt of a raw material according to embodiments of the disclosure provided hereinbelow as well as by a method for manufacturing a crystal according to embodiments of the disclosure provided hereinbelow. The object is further solved by a single-crystal or substrate wafer according to embodiments of the disclosure provided hereinbelow.

The invention is based on the perception, that dislocations positioned locally close to the outer edge of the crystal or wafer and those positioned in the centre (around the axis of symmetry) thereof may originate from two different effects. At the edge of the crystal dislocations develop due to a sliding on crystographically preferred planes, because there thermal and contact stress arises in contact with the crucible. Typically, these dislocations extend a few millimetres into the crystal (compare in this regard the cross-sectional area of the single-crystal 14a schematically depicted in FIG. 7). Dislocations in the centre originate at the seed position (compare in this regard the cross-sectional area of the single-crystal 14b schematically depicted in FIG. 8), at which upon contact between the seed crystal and the melt a thermal shock arises, which in turn leads to the formation of dislocations. Some of these dislocations are oriented such that with the progress of the crystallization or solidification front these extend into the conical region and subsequently into the adjacent cylindrical region of the crystal, respectively.

According to a first embodiment of the invention a device for manufacturing a crystal from a melt of a raw material comprises a crucible configured to receive the melt and including a first section having a first cross-sectional area and a second section configured to receive seed crystal and having a second cross-sectional area, wherein the second cross-sectional area is smaller than the first cross-sectional area, and the first section and the second section are connected with each other directly or via a third section which tapers from the first section to the second section in order to allow the crystallization starting from the seed crystal in a directed temperature field into the freezing or solidifying melt. The second section is also denoted as a seed channel. The first section of the crucible includes a centre axis and the second section is laterally arranged being offset with respect to the centre axis of the first section.

In this embodiment, each contact zone between the seed crystal positioned in the second section, or seed channel, and the melt, i.e., the seed position, is offset from the centre position around the central axis of the crucible towards an edge region, preferably the outermost edge of the crucible cross-section. Consequently, a comparatively extensive amount of the cross-sectional area of the melt freezing or solidifying into the single-crystal is maintained substantially free of dislocations. The edge region, which then may possibly be stronger affected from dislocations, may for example be removed by grinding, polishing, cutting or via alternative methods of removing material. In summary, a single crystal almost or completely free from dislocations can be obtained by the device. If lattice hardening dopants are added to the melt in addition to the above measures, such as for example boron, silicon, zinc, sulphur, indium (for gallium arsenide), gallium (for indium phosphide) etc. each individually or in combination, the desired effect can even be increased.

According to a second embodiment of the invention a device for manufacturing crystal from a melt of a raw material like in the first embodiment comprises a crucible configured to receive the melt and including a first section having a first cross-sectional area and a second section configured to receive seed crystal and having a second cross-sectional area, wherein the second cross-sectional area is smaller than the first cross-sectional area, and the first section and the second section are connected with each other directly or via a third section which tapers from the first section to the second section in order to allow the crystallization starting from the seed crystal in a directed temperature field into the freezing or solidifying melt.

The device hereby is—as it is common in semiconductor manufacturing—configured to manufacture a single-crystal having a nominal diameter, which is to be achieved in a post-processing after the growth process as such is finished. Now, in this embodiment, the first section has an inner diameter associated with its cross-sectional area perpendicular to the centre axis, which is larger than the nominal diameter by 2 mm or more, preferably 3 mm or more, even more preferably 5 mm or more. At the same time this inner diameter may optionally also be larger than the nominal diameter by 10 mm at maximum or 20 mm at maximum.

One advantage of this embodiment is that at a given nominal diameter of the single-crystal to be manufactured, the grown crystal as such is initially formed with an oversize of for example 2-10 mm, 3-10 mm or 5-10 mm. Such oversize can be removed in a process following the proper growth step such as drilling, polishing, grinding, lapping or the similar method step, in order to obtain the nominal diameter.

Since as described above the majority of dislocations are positioned within the then removed edge region of the single-crystal, a residual single-crystal having the nominal diameter and being almost or completely free of dislocations can be obtained. In prior art, oversizes before post-processing amounting only up to 1 mm may be known, in anyway clearly below 2 mm. Of course, the efforts in post-processing are considerably increased due to the larger diameter. Nevertheless, the single-crystal almost or completely free of dislocations when brought to the nominal diameter justifies such increased efforts and the costs resulting thereof.

A particularly advantageous embodiment of the invention relates to a combination of the first two embodiments. Thereby, dislocations originating from the interaction between the crucible wall and the crystallizing melt as well as the dislocations originating from the seed position develop in that edge region of the grown single-crystal, which can be removed in a following process in view of the oversize, in order to arrive at the nominal diameter.

According to a third embodiment of the invention, a device for manufacturing crystal from a melt of a raw material comprises like in the previous embodiments a crucible configured to receive the melt and including a first section having a first cross-sectional area and a second section configured to receive seed crystal and having a second cross-sectional area, wherein the second cross-sectional area is smaller than the first cross-sectional area, and the first section and the second section are connected with each other directly or via a third section which tapers from the first section to the second section in order to allow the crystallization starting from the seed crystal in a directed temperature field into the solidifying melt.

The second section in this embodiment has a length along or parallel to the direction of the central axis, which amounts between 10 mm and 100 mm, preferably between 20 mm and 75 mm, and even more preferably between 30 and 50 mm, each including the boundary values.

An advantage of this embodiment arises from that the second section or the seed channel includes a considerably extended length as compared with seed channels known from prior art. A seed crystal arranged therein is thus positioned—considering comparable size or extent—deeper in the seed channel and thus more remote from the first section of the crucible, in which the economically usable part of the single-crystal having the nominal diameter plus any oversize is obtained during growth.

This is because it has been found, that the dislocations in the crystal extend at an angle with regard to the central axis starting from the seed position. Due to the seed channel expanded in length at least a larger fraction of the dislocations including increased angles with respect to the central axis (here: of the seed channel) terminates on the crucible wall still within the seed channel and thus does not extend further in the direction towards the first section of the crucible which represents the economically usable portion of the grown single crystal.

Further advantageous embodiments arise from methods each associated with one of the devices for manufacturing a single-crystal.

The device may also comprise one or more heating devices, by means of which a directed temperature field is generated, in which the crucible is arranged, which in turn allows the subsequent crystallization of the melt starting from the seed crystal. The invention is not limited to the specific arrangement of the heating device. The heating device may comprise for example heating elements based on thermal radiation, high frequency generators are magnetic field heaters, etc. However, the temperature field should be arranged such that during crystal growth a substantially planar (or just slightly curved) phase boundary is formed.

The described device may be configured to perform growth applying the Vertical Bridgeman (VB) method employing a movable crucible or furnace or applying the Vertical Gradient Freeze (VGF) method. Nevertheless, the invention is not limited to these specific methods. For example the invention may also be applied in the case of Float Zone-techniques etc.

The crucible can be formed from graphite, boron nitride or pyrolytically deposited boron nitride or from any other commonly applied material each selected and adapted for the kind of melt and the corresponding melt temperature. The crucible and/or the heating device may comprise further liners, sheathes or envelopes, for example made from quartz glass.

Furthermore, embodiments are not limited to the manufacturing of gallium arsenide or indium single crystals. For example (GaP—, GaSb—, InSb—, InAs—, etc.) single crystals are comprised as well. Embodiments of the device generally relate to a capability of manufacturing AIII-BV-single-crystals.

According to a further embodiment of the invention the use of a seed crystal is provided, which has dislocations that do not or do hardly propagate in the direction towards the first section of the crucible and thus into the economically usable portion of the grown single-crystal.

Since the dislocation density is closely related to the impurity concentration including the dopant concentration, without adding these materials, it can be reduced only to a conditional extent in connection with the other possibilities described in the present methods. However, it has been found that a dislocation density ≤500 cm$^{-2}$ can be achieved, if a dopant concentration ≤5×10$^{16}$ atoms/cm$^3$ is present.

According to a further embodiment of the invention a single-crystal is provided, particularly a AIII-BV-single-crystal and more particularly a gallium arsenide (GaAs) or indium phosphide (InP) single-crystal including lattice hardening dopants, having an average density of dislocations determined from an a average etch pit density EPD$_{av}$ within a cross-sectional area of the single-crystal perpendicular to its central axis of 10 cm$^{-2}$ oder less, preferably 5 cm$^{-2}$ or less, more preferably 3 cm$^{-2}$ or less, still more preferably 1 cm$^{-2}$ or less, even more preferably completely free from dislocations. For a wafer having a diameter of 150 mm, the total number of etch pits EPC$_{total}$ may be less than 2.000 or is preferably less than 900 or even more preferably lesser than 360, or even zero.

According to a further embodiment of the invention a single-crystal is provided particularly AIII-BV-single-crystal and more particularly comprising gallium arsenide (GaAs) or indium phosphide (InP) without including lattice hardening dopants, and having an average density of dislocations in the atomic lattice of the crystal determined as an average etch pit density EPD$_{av}$ within a cross-sectional area of the single-crystal perpendicular to its central axis of 700 cm$^{-2}$ or less, preferably 500 cm$^{-2}$ or less, more preferably 200 cm$^{-2}$ or less.

If the dislocation density of the single-crystal is particularly low, then fractions of a cross-sectional area perpendicular to the central axis of the single-crystal remain completely free from dislocations. This fraction can be determined according to the standardized measurement method pursuant to SEMI M83: within a cross-sectional area of the single-crystal a fraction P(EPD$_L$=0 cm$^{-2}$) of measurement fields sized as 0.25 mm$^2$ within a measurement grid covering the cross-sectional area completely, said measurement fields being completely free from dislocations, with respect to the total area of the cross-sectional area amounts to 95% or more. Preferred is 97% or more, particularly preferred is, however, 99% or more.

As a consequence, the yield upon manufacturing of components having increased electrical and/or optical power densities such as edge emitting semiconductor lasers or vertical cavity surface emitting semiconductor lasers is considerably increased and thus the economic efficiency of the component production is improved.

The single-crystal may, but not mandatorily, contain lattice hardening dopants. In case of gallium arsenide (GaAs) low amounts of dopant's such as silicon (Si), sulphur (S), tellurium (Te), tin (Sn), selenium (Se), zinc (Zn), carbon (C), beryllium (Be), cadmium (Cd), lithium (Li), germanium (Ge), magnesium (Mg), manganese (Mn), boron (B), aluminum (Al), antimony (Sb), phosphor (P) and indium (In) etc. may be considered to be added to the raw melt individually or in sub combinations etc., such as it is described for example in US 2004/0187768 A1, see paras. 10 and 11 therein.

BRIEF DESCRIPTION OF THE DRAWINGS

Further features, advantages, and purposive embodiments will be described in more detail below by virtue of a description of non-limiting embodiments pertaining to preferred embodiments taken in conjunction with drawings. Therein.

DETAILED DESCRIPTION OF THE INVENTION

Figure 1:
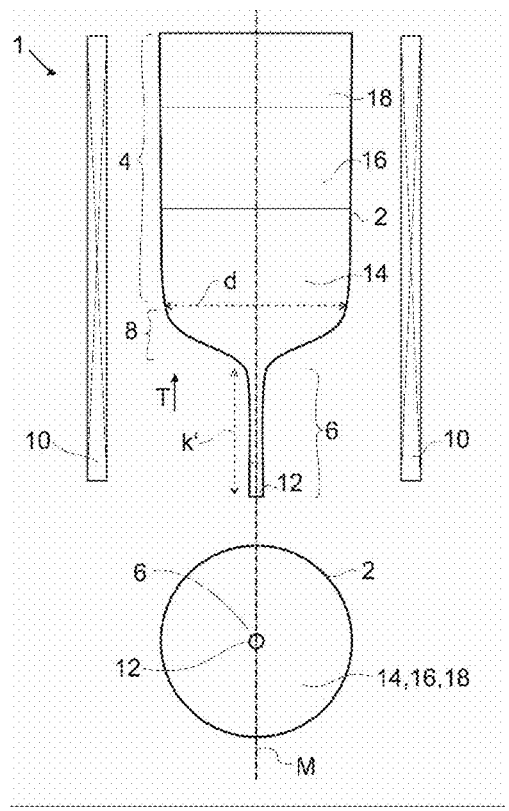
FIG. 1 shows a schematic illustration of a first embodiment of a device for manufacturing a single-crystal from a raw melt, according to the present invention, wherein the seed channel of the crucible is extended or elongated (top: lateral cross-sectional view, bottom: top view)

A first embodiment of a device for manufacturing single-crystal from a raw melt pursuant to the present invention is depicted in FIG. 1. The device 1 comprises a crucible 2 as well as the heating device 10 having annularly arranged heating elements encompassing the crucible. In the upper part of FIG. 1 a cross-sectional view is shown while the bottom part shows a top view of the crucible 2 omitting the heating device 10. The crucible may be received in a quartz glass container (not shown) and closed with respect to its outer environment. The arrangement may correspond to a device for growing crystals pursuant to the Vertical Gradient Freeze (VGF)—method.

The crucible 2 is formed from boron nitride or pyrolytically deposited boron nitride (pBN) and comprises a first cylindrically shaped section 4, which receives the raw melt 16—herein composed of gallium arsenide GaAs—and a second section 6 formed as a seed channel and the third section 8 which forms the transition between the first 4 and the second section 6 and connects these sections. In a region of its second section, the crucible 2 has an inner diameter of at least 152 mm, which is composed of a nominal diameter d of 150 mm that is to be minutely yielded or achieved for the finished single-crystal and of an oversize of up to 2 mm that is conventionally added in the growth process, and which accounts for a grinding step that is subsequently applied to an outer cylinder shell portion of the single-crystal to be manufactured (and that is sacrificed during that step). This grinding step serves for providing a positional accurate, high quality cylinder surface of the crystal required for subsequent alignment steps with regard to the subsequently separated wafer.

In this specific embodiment the seed channel, or the second section 6 respectively, is also shaped cylindrically and has a diameter of for example 10 mm and a length k' of 100 mm. Seed channels according to the invention may also require spatial shapes different from cylindrical and the invention is not limited to the specific shape. The seed channel may also be of a cuboid shape, or may have a polygonal or oval shape in cross-section, etc.

A seed crystal 12 (herein formed from GaAs) is received in the second section 6 having a length of 20 mm and a diameter of slightly less than 10 mm (e.g., 8 or 9 mm) in order to ensure that the distance from the crucible wall is present within the seed channel. The gap in the seed channel maybe filled with liquid boron oxide ($B_2O_3$) such that the melt and crystal is floating in the liquid during crystallization. Due to the considerable difference between the length of the seed crystal 12 and the length k' of the seed channel, the seed crystal 12 is arranged deeply at the bottom in the second section 6. The top face or seed face of the seed crystal is thus distant from the upper end of the second section 6, or the seed channel respectively, by 80 mm. A ratio of the length to the inner diameter of the free space portion not occupied by the seed crystal thus amounts to 8:1.

In the state shown in FIG. 1 a raw melt 16 composed of gallium arsenide has been provided to the crucible 2, which has already been crystallized into a doped GaAs single-crystal 14 starting from the seed face or seed position at the seed crystal 12 within the seed channel, beyond the conical transition, or the third section 8 respectively, and into the cylindrical second section 6, respectively. Further, a lattice hardening dopant such as for example silicon, boron, indium, zinc, sulphur, etc. has been added to the melt.

In the corresponding method (VGF) an amount of silicon is for example added to the melt before or after heating the same (or to its compact or granular precursor). Above the raw melt 16 and between the crystal and the crucible wall there is a layer 18 of liquid (molten) diboron trioxide ($B_2O_3$) because of its lower density, that serves to protect the GaAs melt below as described above. By means of the heating device, a directed temperature field T is generated (the arrow in FIG. 1 points upwards away from the seed crystal 12 towards higher temperatures) using the control device not shown. When the seed crystal 12 starts to be molten, cooling of the raw melt 16 is initiated (by further control of the heating device 10) maintaining the temperature gradient, such that the single-crystal 14 starts to grow upwards starting from the seed face of the seed crystal 12—firstly still within the second section 6 or seed channel, respectively.

Figure 8:
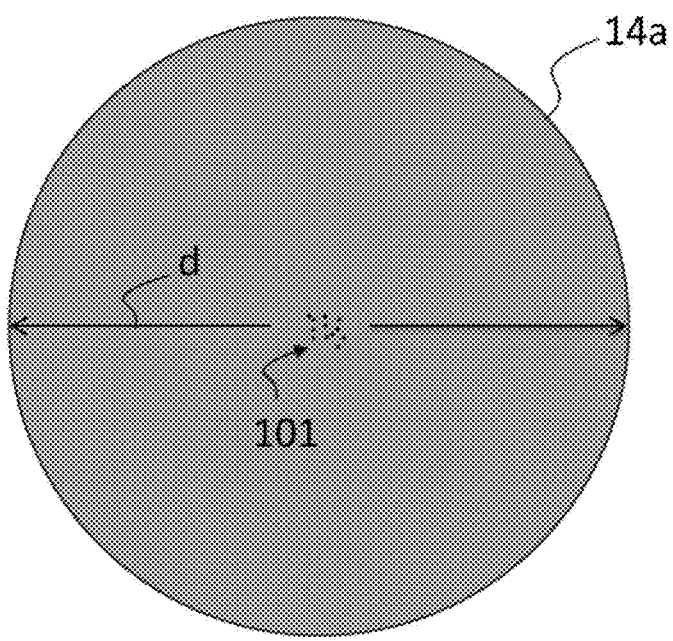
FIG. 8 shows a schematic illustration of a cross-sectional area of a single-crystal revealing dislocations extending or propagating from the seed channel arranged on the central axis of the crucible.

Due to the large ratio between the free length open to crystallization and the inner diameter in the narrow seed channel, the central dislocations 101 as shown in FIG. 8 which due to the seed process as such may hardly be avoided propagate in the crystallization process in an acute angle with regard to the central axis M of the crucible, which in this embodiment also coincides with a central axis of the seed channel, such that it impinges on the crucible wall prior to the crystallization front between the single-crystal 14 and the raw melt 16 reaching the upper end of the seed channel (second section 6). As a consequence, the dislocations thus generated do not exert any further influence onto the further growth. Commonly, dislocations propagate perpendicular to the phase boundary, which itself is slightly curved.

After the dislocations 101 have vanished in the cross-sectional areas of the single-crystal still within the second section 6 (seed channel) of the crucible 2, a single crystal 14 is grown upon further propagation of the crystallization front which is substantially free of dislocations considering an exclusion of the edge areas (80 cm$^2$). A listing of relevant parameters of several samples shown in table 1. Therein sample 1a is a GaAs single-crystal manufactured using a crucible with conventional seed channel, sample 1a serving as a comparative example, while samples 2-5 are manufactured according to the method of the invention in a crucible as shown in FIG. 1 (also GaAs). The values of the parameters $EPD_{av}$ and $EPC_{total}$ listed in table 1 were obtained from wafers after separation from the grown single-crystal. The diameters of the samples amounts to 150 mm.

TABLE 1

|  | Sample 1a (comparative example) | Sample 2 | Sample 3 | Sample 4 | Sample 5 |
|---|---|---|---|---|---|
| $EPD_{av}$ | 235 cm$^{-2}$ | 12 cm$^{-2}$ | 4 cm$^{-2}$ | 0 cm$^{-2}$ | 2 cm$^{-2}$ |
| $EPC_{total}$ | 18.000 | 960 | 320 | 0 | 640 |

Figure 2:
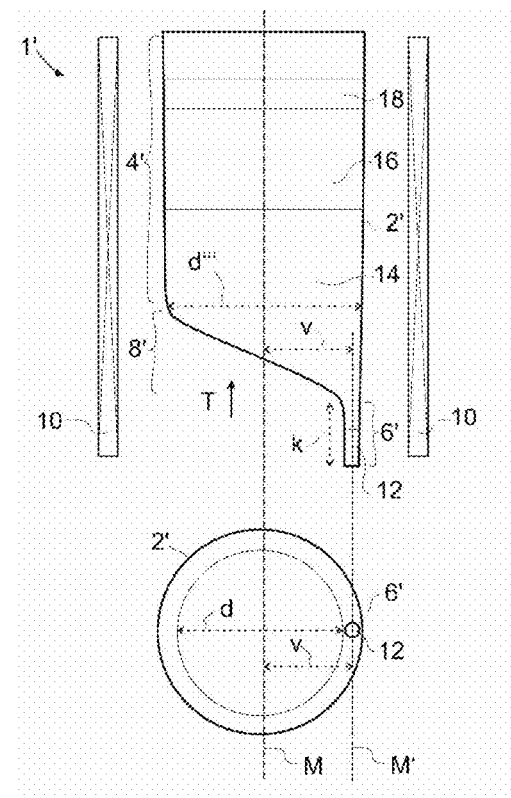
FIG. 2 shows a schematic illustration of a second embodiment of a device for manufacturing a single-crystal from a raw melt, according to the present invention, wherein the seed channel is offset towards the outer edge of the diameter (top: lateral cross-sectional view, bottom: top view)

A second embodiment of a device 1' according to the invention is shown in FIG. 2. In order to avoid repetitions, the same reference numerals as in FIG. 1 denote the same or similar features and in the following it is only referred to the relevant modifications of the device with respect to the first embodiment. The other properties described with regard to the first embodiment are also valid with regard to the second and subsequent embodiments.

The crucible 2' of the second embodiment includes, similar to the first embodiment, a first section 4' for receiving raw melt 16, a second section 6' serving as a seed channel, and a third section 8' serving as the transition region between the seed channel and the first section 4'. The second section 6' has a diameter of 10 mm like in the first embodiment, its length k amounts, however, like in conventional crystal growth devices to 30 mm, for example, such that the seed face of the seed crystal 12 inserted into the seed channel and having a length of 20 mm has a distance from an upper end of the seed channel 12 of only 10 mm. Without general limitation the seed channel in this embodiment is also formed being cylindrical as a mere example. The third section is not provided with rotational symmetry any more in view of the offset v of the second section 6' with regard to the first section 4', and rather tapers laterally outwards in an asymmetrical manner when viewed from the cylindrical first section 4' having the larger inner diameter towards the second section 6' having the smaller diameter.

Instead, the second section 6' is arranged laterally offset with regard to the central axis M of the first section. In other words, a central axis M' of the second section is parallel to the central axis M of the first section 4' based on a mutual offset v between both. In this embodiment, the offset v has a sufficient dimension, such that the central axis M' of the second section 6', or of the sea channel, respectively, extends through an edge exclusion area of cross-sectional areas of the first section 4', when such central axis M' is extended into the first section 4'.

In the second embodiment the first section has an inner diameter d''' of 172 mm. However, the nominal diameter d of the single-crystal 14 to be manufactured also in the present embodiment amounts to only 152 mm. The crucible 2' is thus provided with a considerably larger diameter d''' as compared with the crucible 2 of the first embodiment but also with respect to conventional crucibles, with which a single-crystal is to be manufactured having the given nominal diameter. In this second embodiment, the (extended) central axis M' of the second section 6', or of the seed channel, respectively, thus extends through an edge area of the cross-sectional area as shown in FIG. 2, which is outside and beyond the nominal diameter of the single-crystal 14 to be manufactured (the central axis M' is at a distance from the crucible wall amounting to 5 mm, since the seed channel has an inner diameter of 10 mm, and, if projected along the central axis M (see bottom of FIG. 2), completely extends through the cross-sectional area of the crucible in order to ensure an unimpeded growth in actual direction). The lateral offset v in this embodiment amounts to 80 mm.

Figure 7:
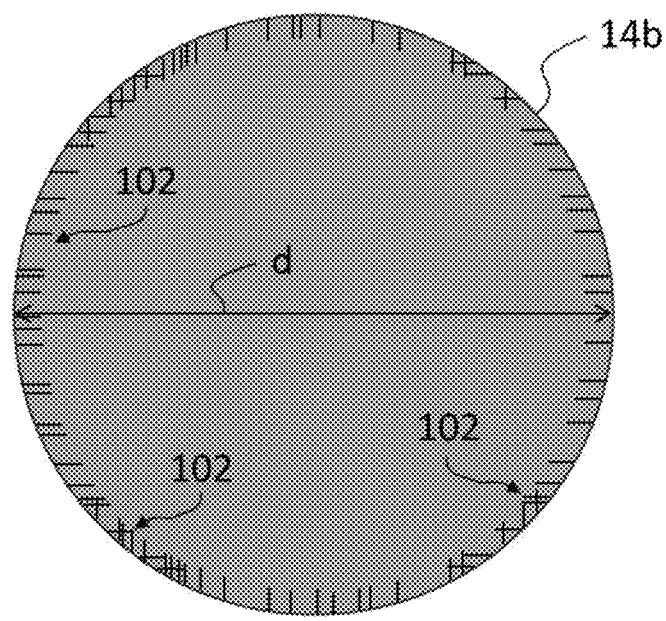
FIG. 7 shows a schematic illustration of a cross-sectional area of a single-crystal revealing edge dislocations.

The method for manufacturing the single-crystal is similar to that in the previous embodiment (for example including the addition of one or more lattice hardening dopants to the melt). However, the subsequent grinding step of the post-processing for smoothing and finishing the cylinder surface of the optionally doped GaAs single-crystal 14 according to prior art is supplemented or even replaced by a further step, in which the oversize of herein 20 mm in diameter (or herein 10 mm in radius) is reduced or removed by drilling or another step capable of more strongly removing material from the cylindrical surface of the single-crystal. Thereby, in the second embodiment material is removed from the cylindrical surface of the single-crystal in symmetrical manner about the central axis of the single-crystal 14 (which coincides with the centre axis M of the first section of the crucible 2'). Advantageously, edge areas of the single-crystal 14 are removed, which had been close to the walls during growth and thus were—as shown in FIG. 7—subjected to a comparatively larger dislocation density conditional of manufacturing. In particular, in connection therewith, the edge dislocations 102 shown in FIG. 7 by means of the schematically depicted single-crystal 14b are removed.

Since moreover due to the specific arrangement, or the offset v respectively, the dislocations 101 (cf. FIG. 8) originating from the seed process propagated into the edge area are removed in the post processing step, a single-crystal 14 is obtained that is free of dislocations or at least substantially free of dislocations. A listing of relevant parameters of several samples are shown in table 2. Therein, sample 1b is a GaAs single-crystal manufactured using a crucible having a conventional seed channel, and serves as a comparative example, while the samples 6-9 (also GaAs) have been manufactured according to the method of the invention using a crucible as shown in FIG. 2. The values of the parameters $EPD_{av}$ and $EPC_{total}$ listed in table 2 were obtained from wafers after separation from the grown single-crystals. The diameter of the samples amounts to 150 m.

TABLE 2

|  | Sample 1b (comparative example) | Sample 6 | Sample 7 | Sample 8 | Sample 9 |
|---|---|---|---|---|---|
| $EPD_{av}$ | 56 cm$^{-2}$ | 8 cm$^{-2}$ | 1 cm$^{-2}$ | 0 cm$^{-2}$ | 2 cm$^{-2}$ |
| $EPC_{total}$ | 8.400 | 1.200 | 150 | 0 | 300 |

Figure 3:
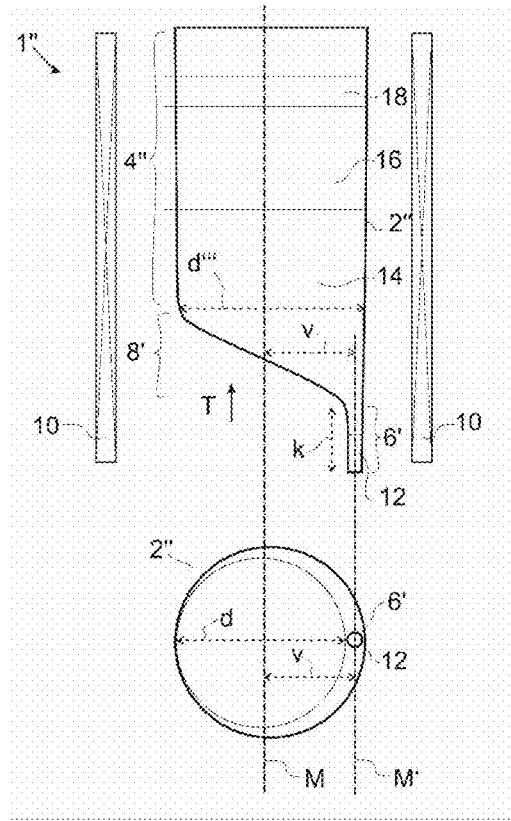
FIG. 3 shows a schematic illustration of a third embodiment of a device for manufacturing a single-crystal from a raw melt, according to the present invention, wherein— starting from the second embodiment (having a short seed channel)—an asymmetrical reduction of the oversize towards the nominal diameter is intended (top: lateral cross-sectional view, bottom: top view)

A third embodiment of a device 1" according to the invention is shown in FIG. 3. The structure of the device as well as the manufacturing of the single-crystal is similar to that of the second embodiment. A difference merely exists in the diameter d" of the first section 4" of the crucible 2". As can be derived from the bottom illustration of the top view in FIG. 3, in the method underlying the third embodiment, an asymmetrical reduction of the oversize is performed in the post-processing step after the proper growth in crucible 2", in order to obtain the nominal diameter d of 152 mm for the single-crystal 14. This line of action allows to exclude substantially only that edge area which shown in FIG. 3 at the bottom on the right side, i.e., to remove in the post-processing step specifically that edge area being affected by dislocations 101 resulting from the seed process, such that as a consequence overall less oversize can be selected for the inner diameter d" of the crucible 2". In the embodiment the inner diameter d" amounts to 162 mm, i.e., 10 mm more than the nominal diameter d of the single-crystal, whose manufacturing device 1" is configured for (d=152 mm). As becomes apparent from FIG. 3, the cross-section of the seed channel, or of the second section 6" respectively, projected into the cross-sectional area of the first section 4" of the crucible 2" completely extends within the edge area of the cross-sectional area of the single-crystal 14 to be manufactured, which is to be removed in the post-processing step. The offset v of the central axis M' of the seed channel with respect to the central axis M of the first section 4" amounts in this embodiment to only 75 mm.

In this embodiment, it is accepted that edge dislocations 102 particularly positioned at the bottom on the left side in FIG. 3 may remain even after the post-processing step in the single-crystal 14, which may originate from a contact with the inner crucible wall during growth. However, the amount of material to be removed as required in the post-processing step is considerably reduced as compared with the second embodiment, which yields from an economical point of view and optimal cost-benefit-ratio. Moreover, there are still achieved excellent values for the average dislocation density of 10 cm$^{-2}$ or less, or of 5 cm$^{-2}$ or less, as well as with regard to the fraction P(EPD$_L$=0 cm$^{-2}$) of measurement fields completely free of dislocations pursuant to the standardized measurement method according to SEMI-M83 with values of 97% or more, or even 99% or more. The relevant parameters for two samples are listed in table 3. Therein sample 1c is a GaAs single-crystal manufactured using a crucible having a conventional seed channel and serves as a comparative example, while sample 10 is manufactured according to the method of the invention using a crucible as shown in FIG. 3 (also GaAs). The values of parameters EPD$_{av}$ and EPC$_{total}$ listed in table 3 were obtained from wafers separated from the grown crystals. The diameter of the samples amounts to 150 mm.

TABLE 3

|  | Sample 1c (comparative example) | Sample 10 |
|---|---|---|
| EPD$_{av}$ | 56 cm$^{-2}$ | 7 cm$^{-2}$ |
| EPC$_{total}$ | 8.400 | 1.000 |

Figure 4:
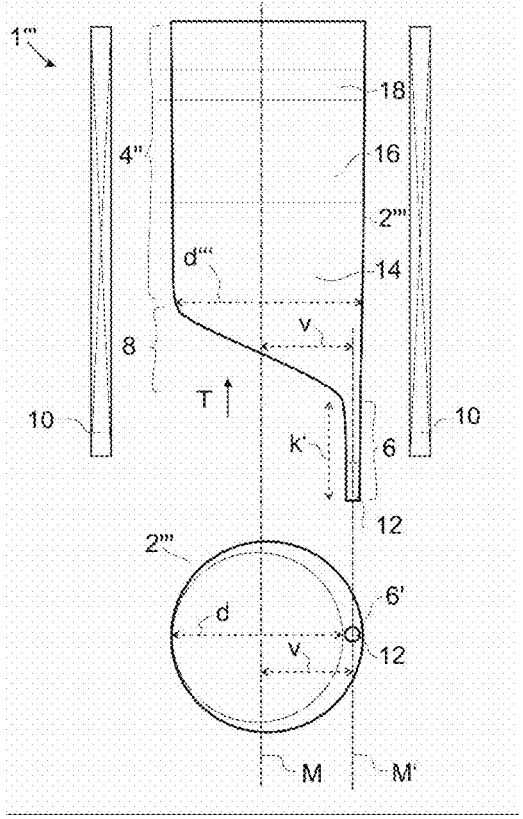
FIG. 4 shows a schematic illustration of a fourth embodiment of a device for manufacturing a single-crystal from a raw melt, according to the present invention, wherein— starting from the third embodiment—the seed channel is extended or elongated similar to the first embodiment (top: lateral cross-sectional view, bottom: top view)

A fourth embodiment of a device 1" according to the invention is shown in FIG. 4. The embodiment includes features of both the first and third embodiments and combines them. The device 1" consequently comprises a crucible 2" formed from boron nitride or pyrolytic boron nitride has the cylindrically shaped first section 4" having an oversize of 2 mm or more with respect to the nominal diameter (in this embodiment 10 mm), wherein the crucible 2" receives the raw melt 16—herein formed from gallium arsenide. The device 1" further comprises the second section 6 formed as a seed channel and extended to length k' with k'=100 mm, and the asymmetric third section 8', which forms the transition between the first section 4" at the second section 6 and connects both with each other.

The advantages and effects are the same as those described above with reference to the first through third embodiments, wherein the advantages are accumulated. Relevant parameters of a sample of single-crystal 14 manufactured using the device are provided in table 4. Therein, a sample 1d is a GaAs single-crystal manufactured using a crucible having a conventional seat channel, and serves as a comparative example, while the sample 11 has been manufactured using the crucible as shown in FIG. 4 (also GaAs). The values of parameters EPD$_{av}$ and EPC$_{total}$ listed in table 4 were obtained from wafers after separation from the grown crystals. The diameter of the samples amounts to 150 m. It shall be remarked, that the samples 1b to 1d are identical.

TABLE 4

|  | Sample 1d (comparative example) | Sample 11 |
|---|---|---|
| EPD$_{av}$ | 56 cm$^{-2}$ | 0 cm$^{-2}$ |
| EPC$_{total}$ | 8.400 | 0 |

Figure 5:
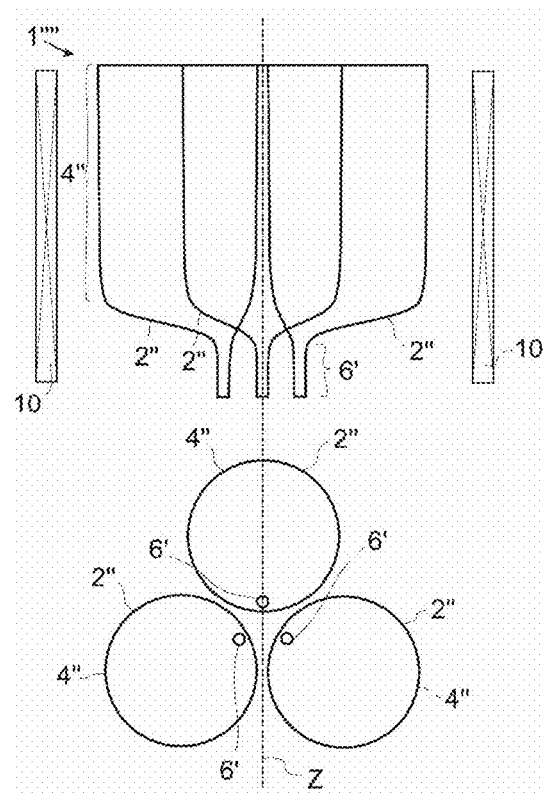
FIG. 5 shows a schematic illustration of an embodiment of a multiple crucible arrangement having seed channels offset towards the direction of the common central axis Z, composed of three of the devices shown in FIG. 3.
Figure 6:
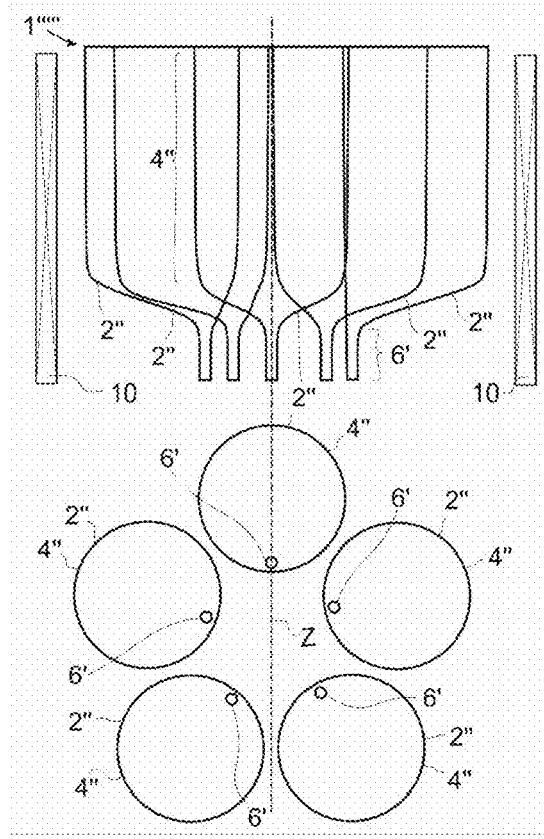
FIG. 6 shows a schematic illustration of an embodiment of a multiple crucible arrangement similar to that in FIG. 5, but composed of five of the devices shown in FIG. 3.

Embodiments of the device 1"" or 1""" comprising multiple crucible arrangement including 3 or 5 crucibles 2" as shown in FIG. 3, respectively, are depicted in FIGS. 5 and 6, respectively. The heating device 10 having one or more heating elements, for example a magnetic field heater, surrounds and heats the crucible arrangement. Filling bodies (not shown), which provide a particular contribution to the home organisation of the temperature field T, in addition to the magnetic field heaters, by conducting heat anisotropically, such as for example graphite, may be arranged between the crucibles 2". One such particularly advantageous arrangement is described for example in U.S. Pat. No. 9,368,585 B2, and the features of the arrangements depicted in FIGS. 1-3 and 11-12 therein are incorporated herein by reference along with corresponding description. The multiple crucible arrangement described in the patent is outstanding due to improved distributions of the etch pit density, i.e., a particularly homogeneous dislocation density.

In these two embodiments the crucible arrangement has a symmetry axis Z, which extends in parallel to the corresponding central axes M of the crucibles 2" through the centre of the arrangement. As viewed from the respective central axes the direction of the offset v is exactly oriented towards the symmetry axis Z. In other words, the corresponding second sections 6' of the crucibles 2" are offset towards the centre of the arrangement.

Such a multiple crucible arrangement allows to generate excellent, stable and homogeneous temperature fields, in particular in a direction towards its centre. By providing offsets of the seed channels in the same manner, the conditions of crystallization are the same in each crucible. Due to the combination of the features of the device 1" according to the invention shown in FIG. 3 (as also of the other embodiments according to FIGS. 1, 2 and 4) with the multiple crucible arrangement, it is particularly taken advantage of synergistic effects.

The above-described embodiments relate to a device configured to perform the VGF-method. However, the invention is not limited to the specific device, and attentive devices may for example also be based on the Vertical Bridgeman method.

The above-described crucibles include in the first section the cylindrical shape. Attentively, there may, however, also be used other shapes such as cuboid-shaped crucibles having a square or rectangular cross-sectional area, or those shapes in which circular segments are separated from generally round cross-sectional areas (for example for the formation of flats).

Modifications of the above described embodiments are possible within the scope of embodiments of the disclosure. Also, as in the fourth embodiment, single elements of the embodiments may be combined with those of other embodiments. For example it is conceivable and possible to put into practice, to arrange in the first embodiment having the symmetrically arranged seed channel first crucible section which is expanded in diameter according to aspects of the invention, i.e., being provided with an increased inner diameter (e.g., d'''=172 mm) in order to perform a post-processing step (drilling, polishing, lapping, or grinding etc.) also therein yielding a corresponding removal of material in a cylinder-wall-shaped or tubular wall-shaped edge area of the single-crystal 14.

For the post-processing step, drilling, polishing, lapping, or grinding are cited as examples in the above embodiments. However, it is a matter of course for the person skilled in the art, that attentively also other methods known in the technical field of materials science for removing material may be applied.

It was also surprisingly found that the reduction of the dislocation density in the described range with respect to the reference values is connected with a further significant reduction of the amount of shear stress of the crystals and the wafers manufactured therefrom. For this purpose, the measurement method of SIRD as described above has been employed.

In order to obtain a unified parameter for the concrete single-crystal/wafer, values of the shear stress obtained for each position on the surface of the wafer (frequency versus shear stress under consideration of the sign) are recorded (see for example FIG. 4 in Geiler et al.), and for the Lorentz curve fitted to these data, for example, a value of the full width at half maximal of this curve is determined, in units of kPa.

Figure 13:
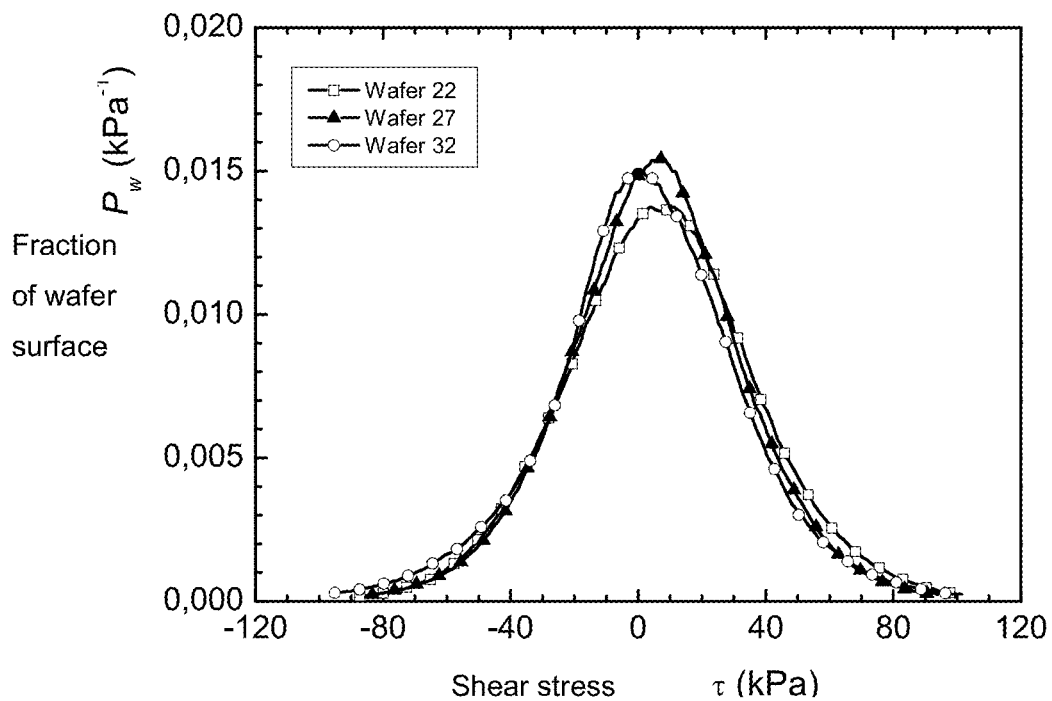
FIG. 13 shows an example in a diagram as an example distributions (frequency $P_W$ per interval of values of shear stress T that has occurred per wafer) of the shear stress measured respectively based on the SIRD method for 3 comparative examples ("wafer 22", "wafer 27", "wafer 37") according to prior art as published in Geiler, Karge, H.; Wagner, M.; Eichler, St.; Jurisch, M.; Kretzer U. Scheffer-Czygan, M.: "*Photoelastic characterization of residual stress in GaAs— wafers*" in: Materials Science in Semiconductor Processing 9 (2006), S. 345-350)

FIG. 13 shows the distribution functions as obtained in Geiler et al. (2006) based on shear stress measured according to the SIRD method for three comparative examples ("wafer 22", "wafer 27", "wafer 37"). In the diagram, there is displayed a fraction $P_w$ (relative frequency per interval of occurred values of shear stress T per wafer) of measurement values obtained in a respective shear stress interval. Geiler et al. (2006) hereby provide a full-width-at-half-maximum FWHM of about 100 kPa with respect to all three comparative examples pertaining to prior art. The same value is approximately derived also as a maximum value (herein, however, as an absolute value) of the measured shear stress, which may be read out at the base of the curve on the left and/or right side.

Figure 9:
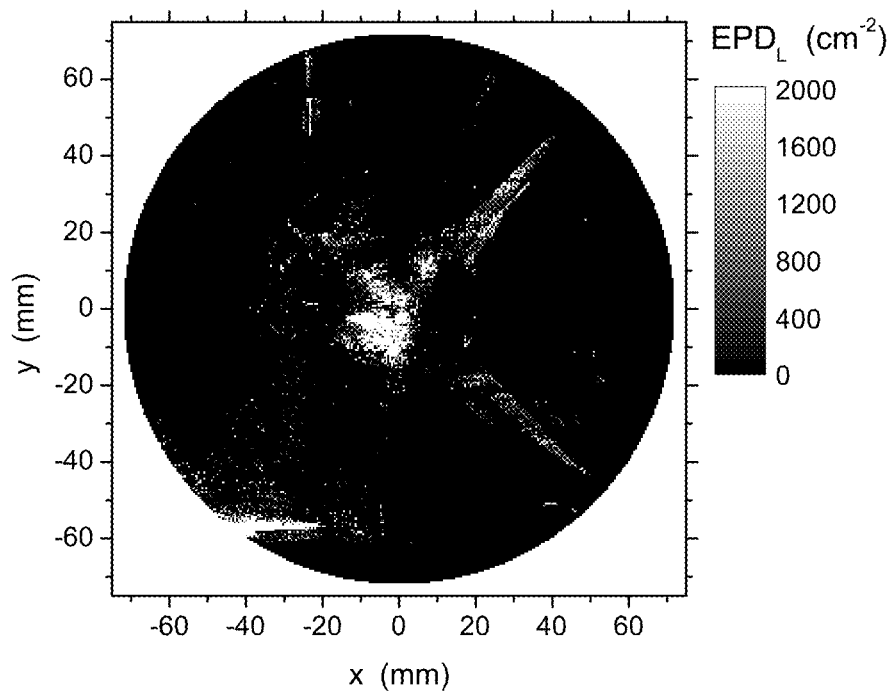
FIG. 9 shows in a greyscale image a distribution of values of the density of locations in the atomic lattice of the crystal determined from spatially resolved measurements within a cross-sectional area of the wafer perpendicular to its central axis M, for a comparative example pursuant to a conventionally grown single-crystal, or wafer, respectively, having a diameter of 150 mm.
Figure 14:
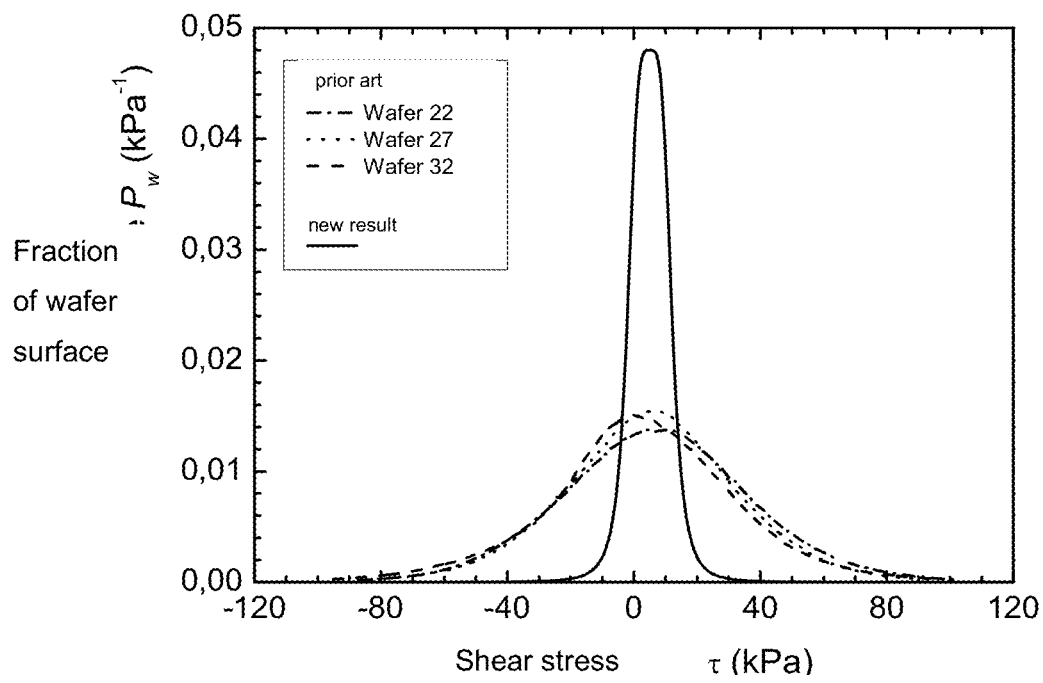
FIG. 14 shows a diagram as in FIG. 13, but for the embodiment of FIGS. 12 and 13 of a single-crystal grown according to the invention, or of the wafer separated therefrom.

As shown in FIG. 14, a reduction of the corresponding values of residual stress or shear stress in the case of single crystals or wafers, respectively, manufactured according to the invention to +/−40 kPa or less, partially to +/−30 kPa or less, or even to +/−25 kPa was successful, beyond the values of residual stress or shear stress as shown in FIG. 9 with respect to the three comparative examples pursuant to Geiler et al. (2006). The Lorentz curve thus obtained is specifically narrow.

This means that measurements performed at wafers according to embodiments, which were obtained from reference crystals, revealed significantly reduced residual stress as compared with wafers examined in Geiler et al. (2006), according to the SIRD-method, see in this regard also a comparison shown in Table 5 between a comparative example and an embodiment.

TABLE 5

| Parameter | unit | Comparative example | Embodiment |
|---|---|---|---|
| $EPD_{av}$ from full surface measurement acc. to SEMI M83 | $cm^{-2}$ | 130 | 3 |
| $EPD_{av}$ from measurement of 69 measurement fields according to SEMI M36 | $cm^{-2}$ | 82 | 0 |
| $P(EPD_L = 0\ cm^{-2})$ from full surface measurement according to SEMI M83 | % | 94.0 | 99.7 |
| Maximum value of shear stress | kPa | 200 | <25 |

Figure 10:
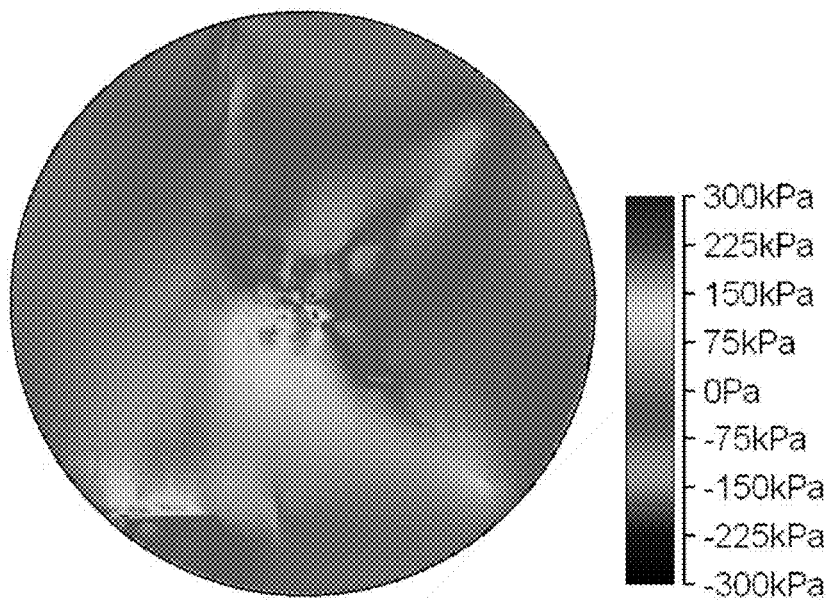
FIG. 10 shows in a greyscale image a distribution of values of the respective shear stress determined from spatially resolved measurements for the comparative example of FIG. 9.

In the comparative example of Table 5, a conventionally manufactured GaAs wafer (as described in Geiler et al. (2006)) having a diameter of 150 mm and separated from a corresponding GaAs single-crystal is concerned. FIG. 9 shows in greyscale the distribution of the measured local etch density $EPD_L$ and FIG. 10 shows in greyscale the distribution of the measured residual or shear stress.

Figure 11:
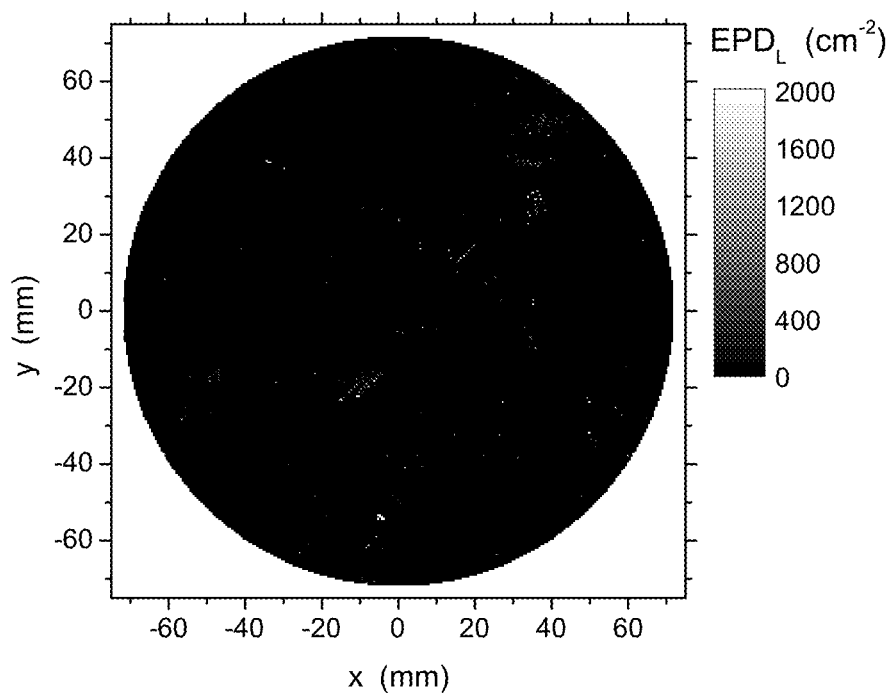
FIG. 11 shows a greyscale image as in FIG. 9 with the distribution of values of the density of dislocations in the atomic lattice of the crystal determined from spatially resolved measurements, but for a corresponding embodiment of the invention.
Figure 12:
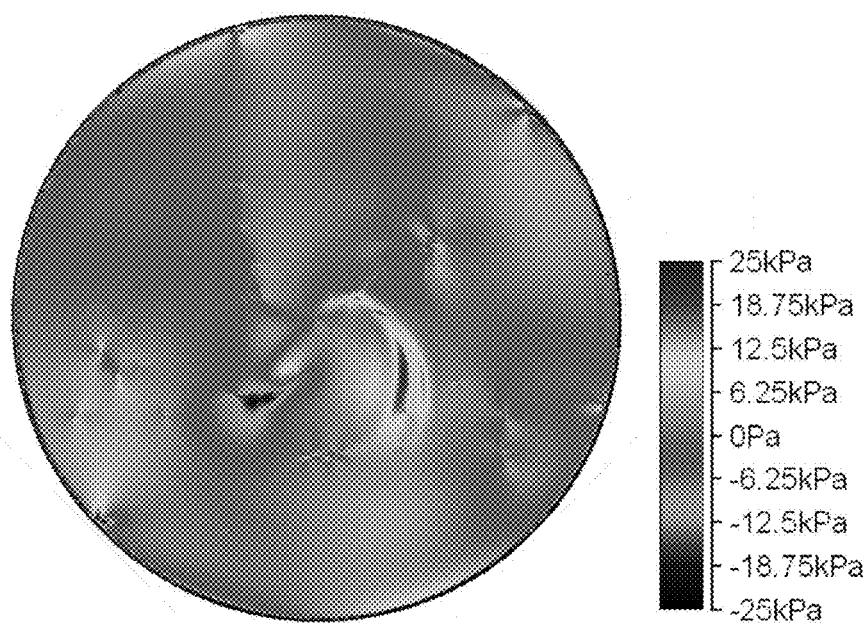
FIG. 12 shows a greyscale image as in FIG. 10 having the distribution of values of the respective shear stress determined from spatially resolved measurements, but for the corresponding embodiment of the invention of FIG. 11.

The corresponding values of maximum shear stress are displayed in Table 5, and in particular for the comparative example as well as for the embodiment. In FIGS. 11 and 12, scales of the greyscale in the upper right corners have to be considered, which reflect the range of corresponding values depicted herein.

It is noted, that in practice up to nowadays vanishing values of the shear stress, i.e., maximum values of the shear stress of about 0 kPa (throughout this analysis, only the absolute amount of shear stress is given, if no sign as stated), has not been reached. This value, or those equal to 0.1 kPa or less, or further even those equal to or less 1 kPa may thus optionally be excluded or disclaimed.

In the various aspects and embodiments explained in the forgoing, the second section includes a longitudinal axis, which, when it is extended into a region of the first section, may extend in a distance of 15 mm or less from an inner wall of the crucible within the first section, but preferably in a distance of 10 mm or less, and even more preferably in a distance of 5 mm or less.

Furthermore, with respect to such aspects and embodiments, the second section 6' may at least partially formed in cylindrical shape and may have an inner diameter of 15 mm or less, in particular in a range from 10 mm to 15 mm, or from 5 mm to 10 mm.

In the various aspects and embodiments explained in the forgoing, the device 1 is configured for manufacturing a crystal having a nominal diameter, which is to be achieved in a post-processing step following a step of growing the crystal, wherein the first section has an inner diameter which is associated with its cross-sectional area perpendicular to the central axis. This inner diameter maybe larger than the nominal diameter by equal to or more than 2 mm, preferably by equal to or more than 3 mm, more preferably by equal to or more than 5 mm, and the inner diameter is larger than the nominal diameter by 10 mm at maximum.

In the various aspects and embodiments explained in the forgoing, the second section 6, 6' has a length k' along a direction of its central axis M, wherein the length may amount to between 40 mm and 120 mm, preferably between 50 mm and 90 mm, more preferably between 60 mm and 80 mm, each range including the boundary values.

Various aspects and embodiments explained in the forgoing concern an AIII-BV-single-crystal or wafer obtained by separation therefrom, i.e., in particular semiconductor compound materials. These may specifically comprise, for example, gallium arsenide (GaAs) or Indium phosphide (InP), etc.

In some of the various aspects and embodiments explained in the forgoing, lattice hardening dopants are included in the single crystal manufactured. In such a case, the lattice hardening dopants may be selected from at least one the group composed of: boron, silicon, zinc, sulphur, indium. However, alternative suitable elements may be encompassed as well and the aspects and embodiments are not limited to those specific dopants listed above.

The invention claimed is:

1. A device for manufacturing a crystal from a melt of a raw material, comprising:
a crucible for receiving the melt having a first section including a first cross-sectional area and having a second section for receiving a seed crystal and including a second cross-sectional area, wherein the second cross-sectional area is smaller than the first cross-sectional area and the first and the second section of connected with each other directly or via a third section which tapers from the first to the second section, in order to allow a crystallization starting from the seed crystal within a directed temperature field into the solidifying melt,
wherein the first section of the crucible has a central axis, and the second section is arranged to be laterally offset from the central axis of the first section; and
wherein the second section has an extended length along a direction of the central axis between 50 and 90 mm and an inner diameter that is less than 15 mm.

2. The device according to claim 1, wherein the second section includes a longitudinal axis, which, when it is extended into a region of the first section, extends in a distance of 15 mm or less from an inner wall of the crucible within the first section.

3. The device according to claim 1, wherein the first section is at least partially formed in cylindrical shape.

4. The device according to claim 1, further comprising a heating device which includes one or more heating elements, the heating device configured to generate the directed temperature field having a temperature gradient, wherein the crucible is arranged in the temperature field.

5. The device according to claim 1, wherein the crucible is formed from boron nitride (BN) or pyrolytically deposited boron nitride (pBN), which is suitable to receive a melt formed from gallium arsenide (GaAs) or indium phosphide (InP).

6. The device according to claim 1, wherein in addition to the crucible, further identical crucibles are provided being arranged symmetrically and in parallel and at the same height, and wherein the one direction, in which the second section is offset from the central axis, is oriented towards the symmetry axis of the arrangement of crucibles.

7. An AIII-BV-single-crystal or wafer obtained by separation therefrom, comprising an average density of dislocations in the lattice of the crystal determined as an average edge pit density (EPDa$_v$) within the cross-sectional area of the single-crystal perpendicular to its central axis (M) in amount of 10 cm$^{-2}$ or less.

8. The AIII-BV-single-crystal or wafer obtained by separation therefrom according to claim 7, wherein boron, silicon, zinc, sulphur, or indium, are incorporated in the lattice of the single-crystal alone or in combination.

9. The AIII-BV-single-crystal or wafer obtained by separation therefrom according to claim 7, comprising a distribution of the residual stress at maximum of +/−30 kPa or less on a cross-sectional area of the single-crystal or of the wafer, obtained by a spatially resolved measurement according to the SIRD method.

10. The AIII-BV-single-crystal or wafer obtained by separation therefrom according to claim 7, wherein within a cross-sectional area of the single-crystal or of the wafer, a fraction of measurement fields sized as 0.25 mm$^2$ within the measurement grid, all measurement fields completely covering the cross-sectional area, the fraction of measurement fields being completely free of dislocations, amounts to 99% of total area of the cross-sectional area, or more.

11. An AIII-BV-single-crystal or wafer obtained by separation therefrom, comprising a distribution of the residual stress at maximum of +/−30 kPa or less, preferably of +/−25 kPa or less, on a cross-sectional area of the single-crystal or of the wafer, obtained by a spatially resolved measurement according to the SIRD method.

12. The AIII-BV-single-crystal or wafer obtained by separation therefrom according to claim 11, wherein the lateral resolution of the spatially resolved measurement amounts to 100 nm.

13. The AIII-BV-single-crystal or wafer obtained by separation therefrom according to claim 11, wherein the diameter of the single-crystal or of the wafer amounts to 150 mm or more.

14. An AIII-BV-single-crystal or wafer obtained by separation therefrom comprising an average density of dislocations in the lattice of the crystal determined as an average edge pit density (EPDa$_v$) within the cross-sectional area of the single-crystal perpendicular to its central axis (M) in amount of 1000 cm$^{-2}$ or less, wherein a charge carrier concentration including lattice hardening dopants, in particular boron, silicon, zinc, sulphur, indium, each alone or in combination, amounts to 7×10$^{16}$ Atoms/cm$^3$ or less, preferably 1×10$^{16}$ atoms/cm$^3$ or less.

15. The AIII-BV-single-crystal according to claim 7, wherein the single crystal comprises Gallium arsenide (GaAs) or Indium phosphide (InP).

16. The AIII-BV-single-crystal according to claim 11, wherein the single crystal comprises Gallium arsenide (GaAs) or Indium phosphide (InP).

17. The AIII-BV-single-crystal according to claim 14, wherein the single crystal comprises Gallium arsenide (GaAs) or Indium phosphide (InP).

18. The AIII-BV-single-crystal or wafer according claim 7 wherein the average edge pit density (EPD$_{av}$) is 8 cm$^{-2}$ or less.

19. The AIII-BV-single-crystal or wafer according claim 7 wherein the wafer has a diameter at least equal to about 150 mm.

* * * * *